(12) United States Patent
Lee

(10) Patent No.: US 11,217,523 B2
(45) Date of Patent: Jan. 4, 2022

(54) SEMICONDUCTOR MEMORY DEVICE AND MANUFACTURING METHOD THEREOF

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/928,517

(22) Filed: Jul. 14, 2020

(65) Prior Publication Data

US 2021/0225758 A1 Jul. 22, 2021

(30) Foreign Application Priority Data

Jan. 17, 2020 (KR) .................. 10-2020-0006824

(51) Int. Cl.
| | |
|---|---|
| *H01L 23/522* | (2006.01) |
| *H01L 27/11524* | (2017.01) |
| *H01L 27/11556* | (2017.01) |
| *H01L 27/1157* | (2017.01) |
| *H01L 21/768* | (2006.01) |
| *H01L 23/528* | (2006.01) |
| *H01L 23/535* | (2006.01) |
| *H01L 27/11582* | (2017.01) |

(52) U.S. Cl.
CPC .... *H01L 23/5225* (2013.01); *H01L 21/76805* (2013.01); *H01L 21/76895* (2013.01); *H01L 23/5226* (2013.01); *H01L 23/5286* (2013.01); *H01L 23/535* (2013.01); *H01L 27/1157* (2013.01); *H01L 27/11524* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| | | |
|---|---|---|
| 9,000,510 B2 | 4/2015 | Hong |
| 2009/0242968 A1 | 10/2009 | Maeda et al. |
| 2013/0294168 A1 | 11/2013 | Shirakawa |
| 2014/0085979 A1 | 3/2014 | Kono |
| 2015/0076578 A1 | 3/2015 | Sakamoto et al. |

(Continued)

FOREIGN PATENT DOCUMENTS

| | | |
|---|---|---|
| KR | 1020100095723 A | 9/2010 |
| KR | 1020160094117 A | 8/2016 |

(Continued)

*Primary Examiner* — Hsien Ming Lee
(74) *Attorney, Agent, or Firm* — William Park & Associates Ltd.

(57) ABSTRACT

A semiconductor device includes bit lines and a common source line connected to a memory cell array, wherein the bit lines and the common source line are spaced apart from each other in a first level; a pad pattern spaced apart from the bit lines and the common source line in the first level; a first insulating layer covering the bit lines, the common source line, and the pad pattern; a shielding pattern overlapping with the bit lines and disposed on the first insulating layer; a first upper line and a second upper line spaced apart from each other above the shielding pattern; a plurality of contact plugs extending from the first and second upper lines toward the bit lines, common source line, and pad pattern, wherein one or more of the plurality of contact plugs connect the shielding pattern to the second upper line.

19 Claims, 11 Drawing Sheets

(56) References Cited

U.S. PATENT DOCUMENTS

| | | |
|---|---|---|
| 2016/0064406 A1 | 3/2016 | Natori et al. |
| 2016/0079259 A1 | 3/2016 | Son et al. |
| 2016/0099256 A1 | 4/2016 | Okamoto |
| 2016/0126251 A1 | 5/2016 | Fujita et al. |
| 2016/0163732 A1 | 6/2016 | Lim et al. |
| 2016/0322376 A1 | 11/2016 | Lee |
| 2017/0062455 A1 | 3/2017 | Nomura |
| 2017/0103992 A1 | 4/2017 | Hachisuga et al. |
| 2017/0213845 A1 | 7/2017 | Baba |
| 2017/0263639 A1 | 9/2017 | Saito et al. |
| 2017/0271364 A1 | 9/2017 | Sakuma et al. |
| 2017/0330887 A1 | 11/2017 | Kim et al. |
| 2018/0082750 A1 | 3/2018 | Ikeda et al. |
| 2018/0211995 A1 | 7/2018 | Bak et al. |
| 2018/0294225 A1 | 10/2018 | Lee et al. |
| 2019/0393238 A1 | 12/2019 | Lim et al. |
| 2020/0126991 A1 | 4/2020 | Yamazaki et al. |
| 2020/0194453 A1 | 6/2020 | Lim |
| 2020/0251149 A1 | 8/2020 | Zhang et al. |
| 2020/0357811 A1* | 11/2020 | Kim .................. H01L 27/11582 |
| 2020/0365617 A1 | 11/2020 | Ahn et al. |
| 2021/0065801 A1 | 3/2021 | Kwon et al. |

FOREIGN PATENT DOCUMENTS

| | | |
|---|---|---|
| KR | 1020180135642 A | 12/2018 |
| KR | 1020190091672 A | 8/2019 |

* cited by examiner

SEMICONDUCTOR MEMORY DEVICE AND MANUFACTURING METHOD THEREOF

CROSS-REFERENCE TO RELATED APPLICATION

The present application claims priority under 35 U.S.C. § 119(a) to Korean patent application number 10-2020-0006824, filed on Jan. 17, 2020, in the Korean Intellectual Property Office, the entire disclosure of which is incorporated herein by reference.

BACKGROUND

1. Technical Field

The present disclosure generally relates to a semiconductor memory device and a manufacturing method thereof, and more particularly, to a semiconductor memory device including a line disposed on a memory cell array and a manufacturing method thereof.

2. Related Art

A semiconductor memory device includes a memory cell array and a peripheral circuit. The memory cell array includes memory cells that are capable of storing data, and the peripheral circuit controls an operation of the memory cell array. The memory cell array and the peripheral circuit may be connected to lines through which driving signals are transmitted. The lines for transmitting the driving signals are disposed on the memory cell array so that the degree of integration of the semiconductor memory device can be improved.

SUMMARY

In accordance with an embodiment of the present disclosure, a semiconductor memory device may include: bit lines and a common source line connected to a memory cell array, wherein the bit lines and the common source line are spaced apart from each other in a first level; a pad pattern spaced apart from the bit lines and the common source line in the first level; a first insulating layer covering the bit lines, the common source line, and the pad pattern; a shielding pattern overlapping with the bit lines and disposed on the first insulating layer; a first upper line and a second upper line spaced apart from each other above the shielding pattern; a first contact plug extending from the pad pattern to be in contact with the first upper line; a second contact plug extending from the common source line to be in contact with the second upper line; a first spacer insulating layer extending toward the first upper line from between the shielding pattern and the first contact plug; and a second spacer insulating layer extending toward the second upper line from between the shielding pattern and the second contact plug.

In accordance with an embodiment of the present disclosure, a method of manufacturing a semiconductor memory device may include: forming bit lines, a common source line, and a pad pattern spaced apart from each other; forming a first insulating layer that covers the bit lines, the common source line, and the pad pattern; sequentially stacking a shielding metal layer and a second insulating layer on the first insulating layer; forming a first hole that overlaps with the pad pattern by etching the second insulating layer and the shielding metal layer; forming a first spacer insulating layer on a sidewall of the first hole; forming a first contact plug on the first spacer insulating layer by filling the first hole, wherein the first contact plug extends to be in contact with the pad pattern; and forming a first upper line that is connected to the first contact plug, wherein the first upper line extends onto the second insulating layer.

In accordance with an embodiment of the present disclosure, a semiconductor memory device may include: bit lines and a common source line connected to a memory cell array, wherein the bit lines and the common source line are spaced apart from each other in a first level; a pad pattern spaced apart from the bit lines and the common source line in the first level; a first insulating layer covering the bit lines, the common source line, and the pad pattern; a shielding pattern overlapping with the bit lines and disposed on the first insulating layer; a first upper line and a second upper line spaced apart from each other above the shielding pattern; a plurality of contact plugs extending from the first and second upper lines toward the bit lines, common source line, and pad pattern, wherein one or more of the plurality of contact plugs connect the shielding pattern to the second upper line.

BRIEF DESCRIPTION OF THE DRAWINGS

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure may be implemented in various forms, and should not be construed as limited to the embodiments set forth herein.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments provide a semiconductor memory device capable of increasing the degree of freedom of upper lines and improving the operational reliability of the semiconductor memory device, and a manufacturing method of the semiconductor memory device.

Figure 1:
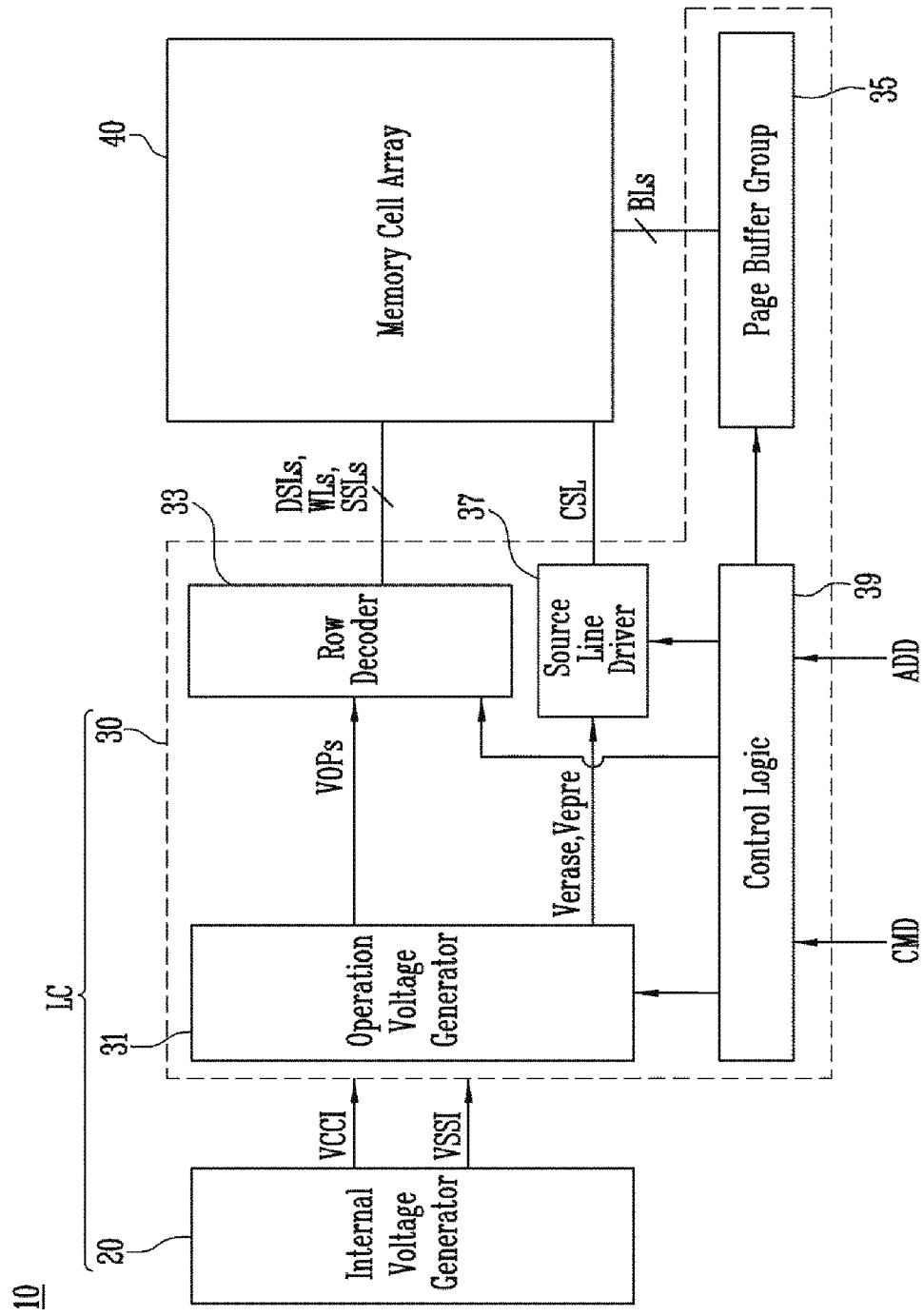
FIG. 1 is a block diagram illustrating a semiconductor memory device in accordance with an embodiment of the present disclosure.

FIG. 1 is a block diagram illustrating a semiconductor memory device 10 in accordance with an embodiment of the present disclosure.

Referring to FIG. 1, the semiconductor memory device 10 may include a logic circuit LC and a memory cell array 40. The logic circuit LC may include an internal voltage generator 20 and a peripheral circuit 30.

The internal voltage generator 20 may generate various internal voltages by receiving an external voltage. Internal voltages that are output from the internal voltage generator 20 may be supplied to the peripheral circuit 30. In an embodiment, the internal voltages may include an internal power voltage VCCI and an internal ground voltage VSSI.

The peripheral circuit 30 may perform a program operation to store data in the memory cell array 40, a read operation to output data that is stored in the memory cell array 40, and an erase operation to erase data that is stored in the memory cell array 40. Internal voltages that are required to activate the peripheral circuit 30 may be supplied from the internal voltage generator 20 to the peripheral circuit 30.

In an embodiment, the peripheral circuit 30 may include a control logic 39, an operation voltage generator 31, a row decoder 33, a source line driver 37, and a page buffer group 35.

The memory cell array 40 may include a plurality of memory blocks. Each of the memory blocks may be connected to one or more drain select lines DSLs, a plurality of word lines WLs, one or more source select lines SSLs, a plurality of bit lines BLs, and a common source line CSL.

The control logic 39 may control the peripheral circuit 30 in response to a command CMD and an address ADD.

The operation voltage generator 31 may generate various operation voltages VOPs that are used for a program operation, a read operation, and an erase operation based on the control logic 39. The operation voltages VOPs may include a program voltage, a verify voltage, a pass voltage, a select line voltage, and the like.

The row decoder 33 may select a memory block based on the control logic 39. The row decoder 33 may apply the operation voltages VOPs to drain select lines DSLs, word lines WLs, and source select lines SSLs, which are connected to the selected memory block.

The source line driver 37 may be connected to the memory cell array 40 through the common source line CSL. The source line driver 37 may perform a discharge operation of the common source line CSL based on the control logic 39. In an embodiment, the source line driver 37 may apply a pre-erase voltage Vepre and an erase voltage Verase to the common source line CSL in an erase operation based on the control logic 39. The pre-erase voltage Vepre and the erase voltage Verase may be generated by the operation voltage generator 31.

The page buffer group 35 may be connected to the memory cell array 40 through the bit lines BLs. The page buffer group 35 may temporarily store data that is received from an input/output circuit (not shown) in a program operation based on the control logic 39. The page buffer group 35 may sense voltages or currents of the bit lines BLs in a read operation or verify operation based on the control logic 39. The page buffer group 35 may selectively float the bit lines BLs based on the control logic 39.

The logic circuit LC may be formed on a substrate, and the memory cell array 40 may be disposed on the logic circuit LC. The memory cell array 40 may overlap with a portion of the logic circuit LC.

Figure 2:
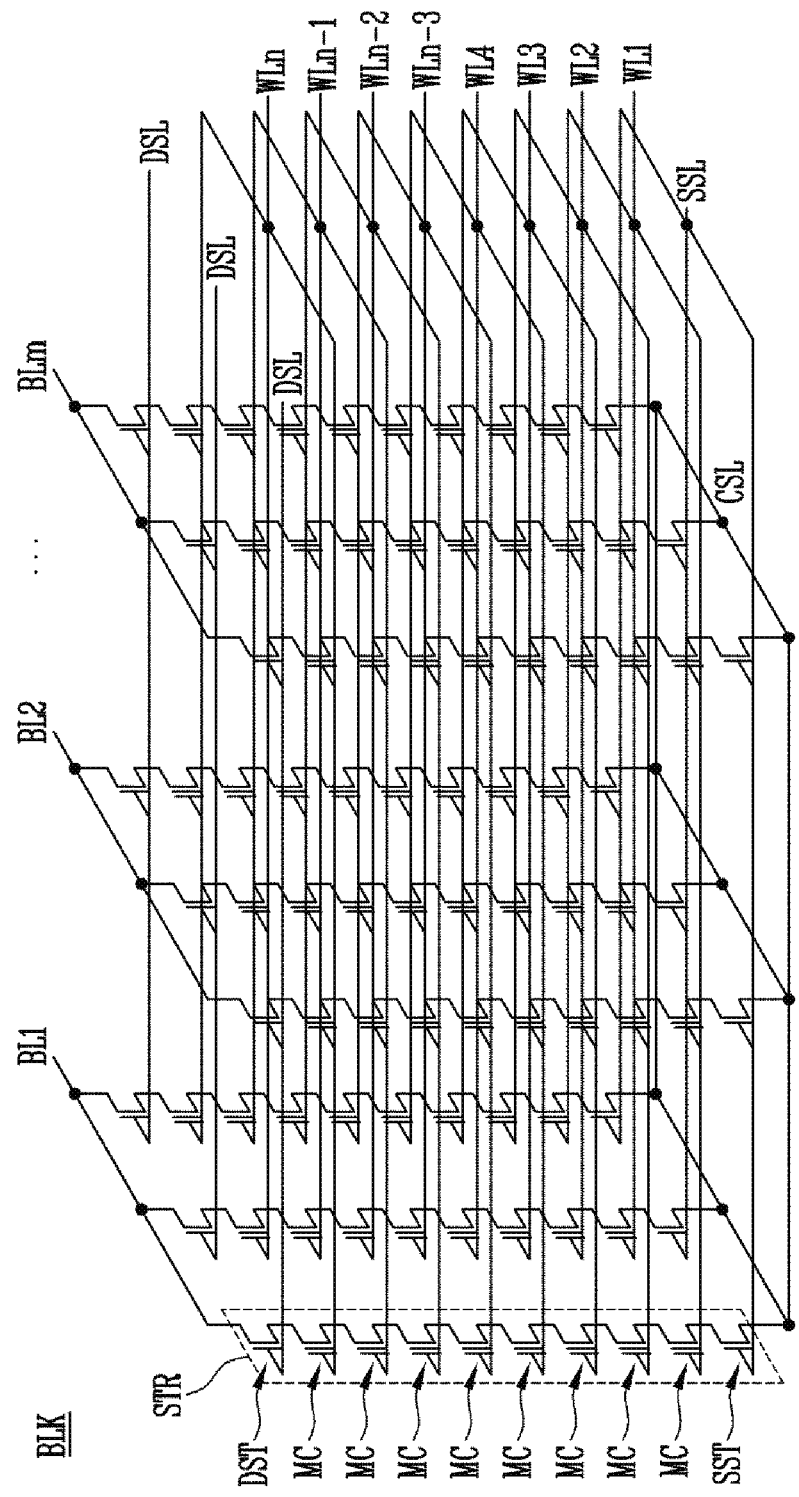
FIG. 2 is an equivalent circuit diagram illustrating a memory block in accordance with an embodiment of the present disclosure.

FIG. 2 is an equivalent circuit diagram illustrating a memory block BLK in accordance with an embodiment of the present disclosure.

Referring to FIG. 2, the memory block BLK may include a plurality of memory cell strings STR that are commonly connected to a common source line CSL. The memory cell strings STR may be divided into a plurality of column groups that are respectively connected to bit lines BL1 to BLm. Memory cell strings STR of each column group may be connected, in parallel, to a bit line that corresponds to the column group.

Each of the memory cell strings STR may include at least one drain select transistor that is connected to a bit line, at least one source select transistor that is connected to the common source line CSL, and a plurality of memory cells that are connected, in series, between the drain select transistor and the source select transistor. A gate of the drain select transistor may be connected to a drain select line, gates of the memory cells may be connected to word lines, and a gate of the source select transistor may be connected to a source select line.

In an embodiment, each of the memory cell strings STR may be connected to a drain select line DSL, a plurality of word lines WL1 to WLn, and a source select line SSL. Each of the memory cell strings STR may include a drain select transistor DST that is connected to the drain select line DSL, a plurality of memory cells MC that are connected to the word lines WL1 to WLn, and a source select transistor SST that is connected to the source select line SSL. The memory cells MC of each of the memory cell strings STR may be connected in series.

The memory cells MC connected in series and a bit line may be connected through the drain select transistor DST. The memory cells MC connected in series and the common source line CSL may be connected through the source select transistor SST.

The structure of each of the memory cell strings STR is not limited to the embodiment as shown in FIG. 2. In an embodiment, each of the memory cell strings STR may include two or more drain select transistors connected in series to a bit line corresponding thereto. Drain select lines of two or more layers may be disposed between the bit lines BL1 to BLm and the word lines WL1 to WLn. In an embodiment, each of the memory cell strings STR may further include two or more source select transistors that are connected, in series, to the common source line CSL. Source select lines of two or more layers may be disposed under the word lines WL1 to WLn.

At least one of the word lines WL1 to WLn may be used as a dummy word line. For example, at least one of the word line WL1 that is adjacent to the source select line SSL and the word line WLn that is adjacent to the drain select line DSL may be used as a dummy word line.

An erase operation of the semiconductor memory device may be performed by generating a Gate Induced Drain Leakage (GIDL) current at the source select transistor SST. In an embodiment, the erase operation of the semiconductor memory device may include a hot-hole-forming period and an erase period.

Referring to FIGS. 1 and 2, during the hot-hole-forming period of the erase operation, the row decoder 33 may control the word lines WL1 to WLn of a selected memory block to be in a floating state, and the page buffer group 35 may control the bit lines BL1 to BLm of the selected memory block to be in a floating state.

During the hot-hole-forming period of the erase operation, the operation voltage generator 31 may apply a pre-erase voltage Vepre to the common source line CSL. The pre-erase voltage Vepre may apply to generate a Gate Induced Drain Leakage (GIDL) current. When a voltage level of the source select line SSL is low, a GIDL current may be generated between the common source line CSL and the source select line SSL. In an embodiment, during the hot-hole-forming period of the erase operation, the row decoder 33 may control the source select line SSL to have a ground voltage level.

When a GIDL current is generated, hot holes may be generated. The generated hot holes may be injected into a channel region of the memory cell string STR. Accordingly, a channel voltage of the memory cell string STR may be increased.

Subsequently, during the erase period of the erase operation, the operation voltage generator 31 may apply an erase voltage Verase that is higher than the pre-erase voltage Vepre to the common source line CSL. As a result, the channel voltage of the memory cell string STR is further increased.

During the erase period of the erase operation, the row decoder 33 may control the source select line SSL to be in a floating state and may control the word lines WL1 to WLn to have a ground voltage level. Accordingly, data that is stored in the memory cells MC may be erased due to a voltage difference between the word lines WL1 to WLn and the channel region of the memory cell string STR with the increased potential level.

The erase operation may be ended when the source select line SSL is turned off by controlling the source select line SSL to have a ground voltage level through the row decoder 33.

In order to improve the efficiency of the above-described GIDL erase operation, during the erase operation, the voltage that is applied to the common source line CSL may be applied to the bit lines BL1 to BLm, and a voltage that is applied to the source select line SSL may be applied to the drain select line DSL. Accordingly, during the erase operation, a GIDL current may be generated between the drain select line DSL and the junction region of the drain select transistor DST so that erase efficiency may be improved.

Figure 3A:
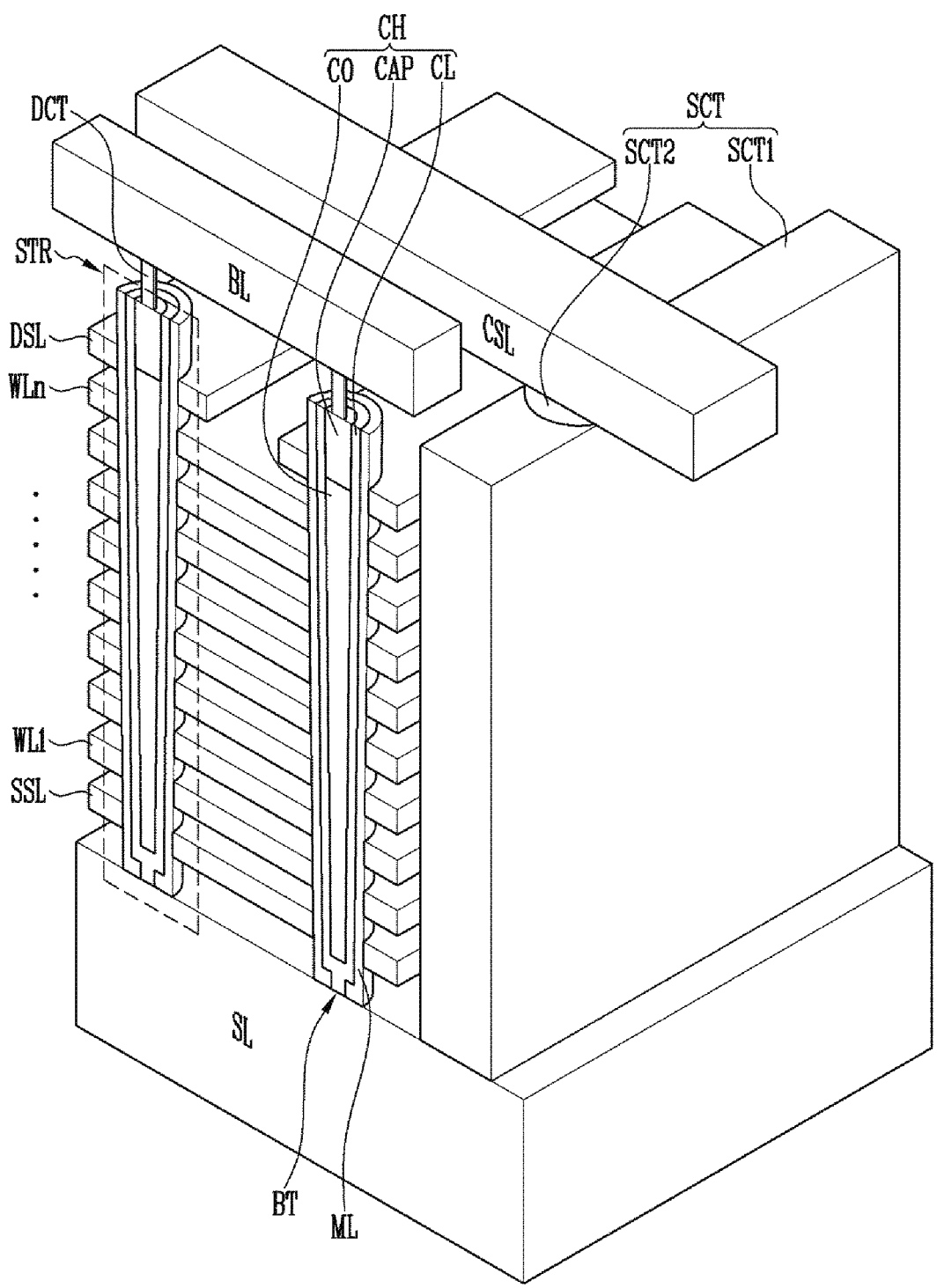
FIGS. 3A and 3B are views illustrating various embodiments of a memory cell array.
Figure 3B:
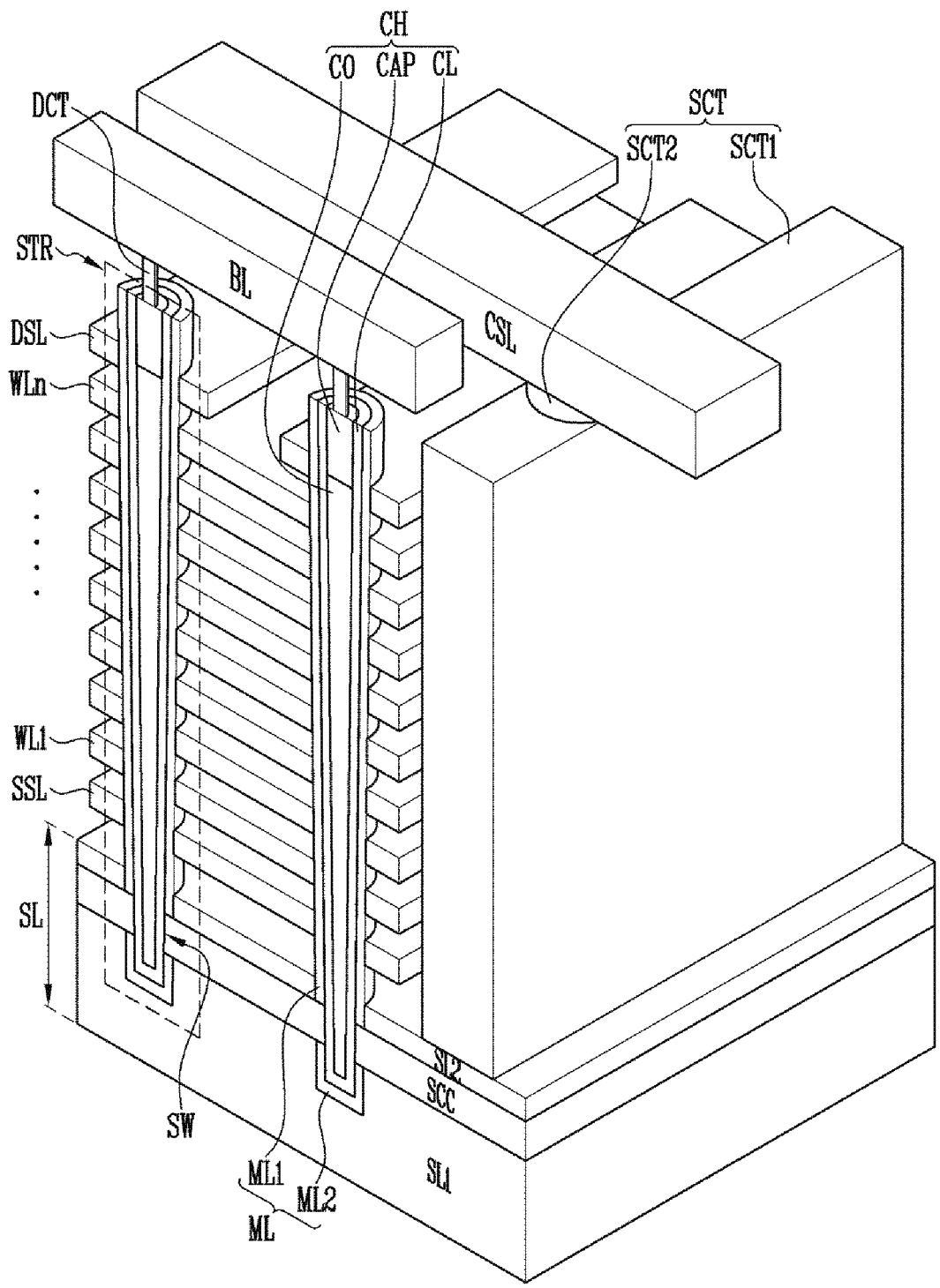

FIGS. 3A and 3B are views illustrating various embodiments of the memory cell array.

Referring to FIGS. 3A and 3B, each of the memory cells may include memory cell strings STR that are connected, in parallel, to a bit line BL as shown in FIG. 2.

The source select line SSL, the word lines WL1 to WLn, and the drain select line DSL, which are described with reference to FIG. 2, may be stacked between a source semiconductor layer SL and the bit line BL. The source select line SSL, the word lines WL1 to WLn, and the drain select line DSL may be spaced apart from each other. The source select line SSL, the word lines WL1 to WLn, and the drain select line DSL may surround channel structures CH. The design of channel structures CH that are controlled by each of the source select line SSL, the word lines WL1 to WLn, and the drain select line DSL is not limited to the example shown in the drawings, and may be varied.

The common source line CSL described with reference to FIG. 2 may be connected to the memory strings STR via a source contact structure SCT and the source semiconductor layer SL. The source semiconductor layer SL may include a dopant. In an embodiment, the source semiconductor layer SL may include an n-type doped silicon layer.

The source contact structure SCT may include a first source contact SCT1 and a second source contact SCT2. The first source contact SCT1 may extend, in parallel, to the channel structures CH toward the common source line CSL from the source semiconductor layer SL. The second source contact SCT2 may extend from the first source contact SCT1 to be in contact with the common source line CSL.

Each of the channel structures CH may extend toward the bit line BL from the source semiconductor layer SL. Each of the channel structures CH may include a channel layer CL. In an embodiment, the channel layer CL may be formed in a hollow type, and be in contact with the source semiconductor layer SL. A central region of each of the channel structures CH, which is defined by the hollowed-out area of the channel layer CL, may be filled with a core insulating layer CO and a capping semiconductor layer CAP. The capping semiconductor layer CAP may be disposed on the core insulating layer CO.

The channel layer CL may be formed of a semiconductor material. In an embodiment, the channel layer CL may include silicon. The capping semiconductor layer CAP may include a dopant. In an embodiment, the capping semiconductor layer CAP may include an n-type doped silicon layer. The dopant may be diffused into the channel layer CL from the capping semiconductor layer CAP.

Each of the channel structures CH may be surrounded by a memory layer ML. The memory layer ML may include a tunnel insulating layer, a data storage layer, and a blocking insulating layer, which are sequentially stacked on an outer wall of the channel structure CH. The tunnel insulating layer may include silicon oxide through which charges can tunnel. The data storage layer may be formed of a charge trapping layer. In an embodiment, the charge trapping layer may include silicon nitride. The blocking insulating layer may include an oxide that is capable of blocking charges. The data storage layer may be formed of various materials in addition to the charge trapping layer. The data storage layer may be deformed in various forms between the tunnel insulating layer and the blocking insulating layer based on the structure of a cell to be implemented. In an embodiment, the data storage layer may be formed of a phase change material layer or may be formed of a material layer for floating gates.

The bit line BL may be connected to the channel structures CH via drain contact structures DCT.

Each of the channel structures CH may be in contact with the source semiconductor layer SL. In an embodiment, each of the channel structures CH may have a bottom surface BT that penetrates the memory layer ML and is in contact with the source semiconductor layer SL as shown in FIG. 3A. In an embodiment, each of the channel structures CH may have a sidewall SW in contact with the source semiconductor layer SL as shown in FIG. 3B.

Referring to FIG. 3B, the source semiconductor layer SL may include a first source layer SL1, a source channel contact layer SCC, and a second source layer SL2. Each of the channel structures CH may extend to the inside of the first source layer SL1. The source channel contact layer SCC may penetrate the memory layer ML between the first source layer SL1 and the second source layer SL2 and may be in contact with the sidewall SW of each of the channel structures CH. The memory layer ML may be separated into a first memory pattern ML1 and a second memory pattern ML2 by the source channel contact layer SCC. Each of the first source layer SL1, the source channel contact layer SCC, and the second source layer SL2 may include a doped semiconductor layer. In an embodiment, each of the first source layer SL1, the source channel contact layer SCC, and the second source layer SL2 may include a doped silicon layer.

According to the structures shown in FIGS. 3A and 3B, the memory cells MC described with reference to FIG. 2 may be defined at intersection portions of the word lines WL1 to WLn and each channel structure CH. The source select transistor SST, described with reference to FIG. 2, may be defined at an intersection portion of the source select line SSL and each channel structure CH. The drain select transistor DST described with reference to FIG. 2 may be defined at an intersection portion of the drain select line DSL and each channel structure CH. The source select transistor SST, the memory cells MC, and the drain select transistor DST, which are described with reference to FIG. 2, may be connected, in series, by the channel structure CH, to form a cell string STR.

Figure 4:
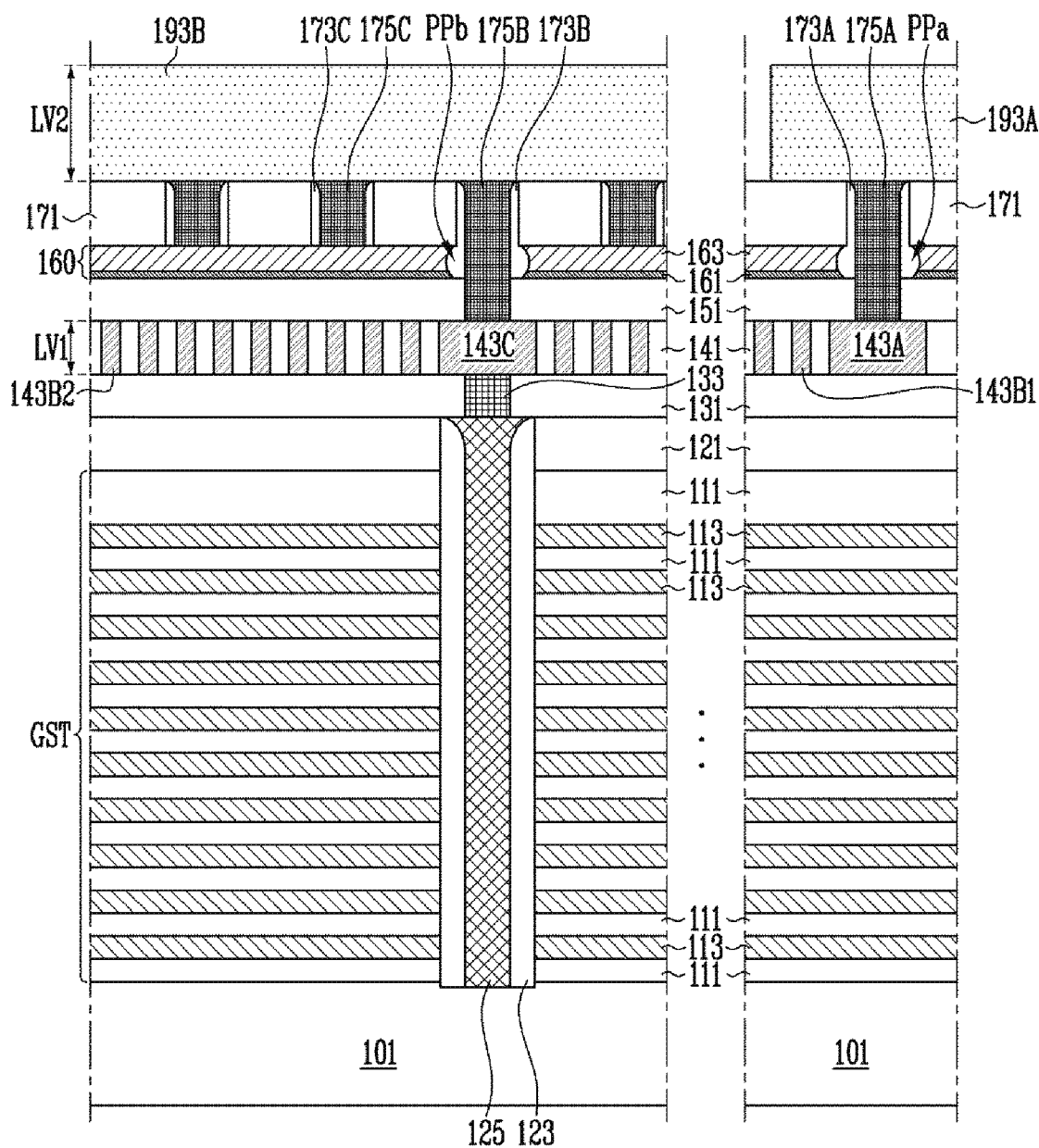
FIG. 4 is a sectional view illustrating a semiconductor memory device in accordance with an embodiment of the present disclosure.

FIG. 4 is a sectional view illustrating a semiconductor memory device in accordance with an embodiment of the present disclosure. FIG. 4 is a sectional view that is taken in a direction intersecting bit lines 143B1 and 143B2. A sectional view shown at the right of FIG. 4 illustrates a structure that overlaps with a first upper line 193A that is used as a power line to transmit the internal power voltage VCCI or the internal ground voltage VSSI, which is described with reference to FIG. 1. A sectional view shown at the left of FIG. 4 illustrates a structure that overlaps with a second upper line 193B to transmit the pre-erase voltage Vepre and the erase voltage Verase, which are described with reference to FIGS. 1 and 2, in an erase operation.

Referring to FIG. 4, the source select line SSL, the word lines WL1 to WLn, and the drain select line DSL, which are shown in FIGS. 3A and 3B, may be implemented through conductive patterns 113 of a gate stack structure GST.

The gate stack structure GST may be disposed on a source semiconductor layer 101. The source semiconductor layer 101 may correspond to the source semiconductor layer SL that is described with reference to FIG. 3A or 3B. The gate stack structure GST may include interlayer insulating layers 111 and the conductive patterns 113, which are alternately stacked on the source semiconductor layer 101. The interlayer insulating layers 111 and the conductive patterns 113 may extend to surround the channel structures CH that is described with reference to FIG. 3A or 3B.

A memory cell array including the gate stack structure GST may be covered by a first upper insulating layer 121 and a second upper insulating layer 131. The first upper insulating layer 121 and the second upper insulating layer 131 may be disposed between the gate stack structure GST of the memory cell array and a first level LV1 in which a pad pattern 143A, the bit lines 143B1 and 143B2, and a common source line 143C are disposed.

A first source contact 125 that is in contact with the source semiconductor layer 101 may extend, in parallel, to a sidewall of the gate stack structure GST. The first source contact 125 may be formed of various conductive materials, such as a doped semiconductor layer, metal, metal silicide, and the like. The first source contact 125 may extend to penetrate the first upper insulating layer 121.

The first source contact 125 may be insulated from the gate stack structure GST by a sidewall insulating layer 123 that is formed on the sidewall of the gate stack structure GST.

The second upper insulating layer 131 may be disposed on the first upper insulating layer 121 and may extend to cover the first source contact 125. A second source contact 133 and the drain contact structure DCT described with reference to FIG. 3A or 3B may extend to penetrate the second upper insulating layer 131. The second source contact 133 may be formed of various conductive materials.

A third upper insulating layer 141 may be disposed in the first level LV1. The third upper insulating layer 141 may be penetrated by the pad pattern 143A, the bit lines 143B and 143B2, and the common source line 143C.

Figure 5A:
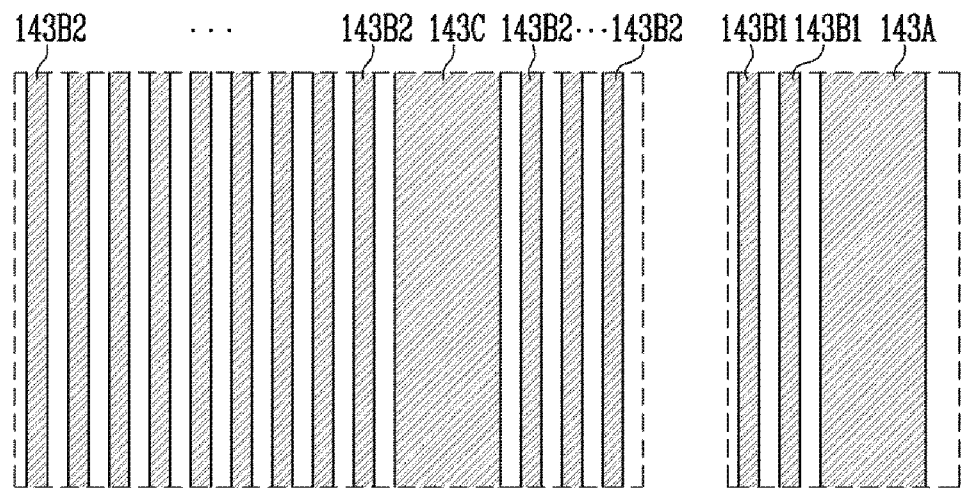
FIG. 5A is a plan view illustrating a layout of a pad pattern, bit lines, and a common source line, which are shown in FIG. 4.

FIG. 5A is a plan view illustrating a layout of the pad pattern 143A, the bit lines 143B1 and 143B2, and the common source line 143C, which are shown in FIG. 4.

Referring to FIGS. 4 and 5A, the pad pattern 143A, the bit lines 143B1 and 143B2, and the common source line 143C may be disposed in the first level LV1 to be spaced apart from each other. The pad pattern 143A, the bit lines 143B1 and 143B2, and the common source line 143C may be made of the same conductive material. In an embodiment, the pad pattern 143A, the bit lines 143B1 and 143B2, and the common source line 143C may include a low resistance metal, such as copper (Cu).

The pad pattern 143A may be a pattern that is connected to an output pad (not shown) to output the internal ground voltage VSSI or the internal power voltage VCCI, which is described with reference to FIG. 1. Although not shown in the drawing, the output pad may be formed on a substrate which does not overlap with the gate stack structure GST, and the pad pattern 143A may extend to overlap with the output pad.

Each of the bit lines 143B1 and 143B2 may be connected to a channel structure that penetrates the gate stack structure GST through a drain contact structure DCT as shown in FIG. 3A or 3B. The bit lines 143B1 and 143B2 may include first bit lines 143B1 that are adjacent to the pad pattern 143A and second bit lines 143B2 that are adjacent to the common source line 143C.

The common source line 143C may be connected to a second source contact 133 that overlaps with the common source line 143C. The common source line 143C may be connected to the source semiconductor layer 101 through the first source contact 125 and the second source contact 133.

Referring to FIG. 4, a first insulating layer 151 may be disposed on the third upper insulating layer 141. The first insulating layer 151 may extend to cover the pad pattern 143A, the bit lines 143B1 and 143B2, and the common source line 143C. The first insulating layer 151 may include a material that can be used as a diffusion barrier or etch stop layer. In an embodiment, the first insulating layer 151 may include a nitrogen-doped silicon carbide (NDC). For example, the first insulating layer 151 may include a silicon carbide nitride layer (SiCN).

A shielding pattern 160 may be disposed on the third upper insulating layer 141. The shielding pattern 160 may extend to overlap with the first bit lines 143B1 and the second bit lines 143B2.

Figure 5B:
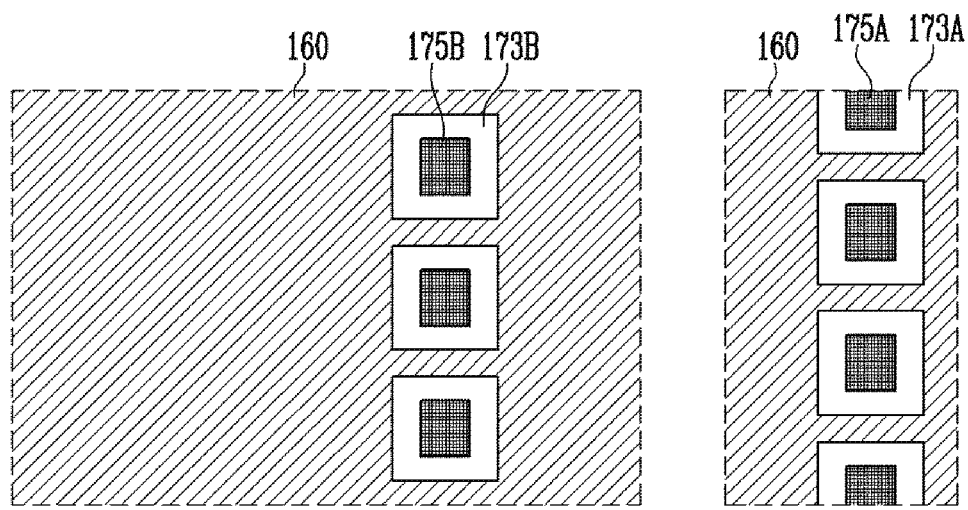
FIG. 5B is a plan view illustrating a layout of a shielding pattern shown in FIG. 4.

FIG. 5B is a plan view illustrating a layout of the shielding pattern 160 shown in FIG. 4.

Referring to FIGS. 4 and 5B, the shielding pattern 160 may be penetrated by first contact plugs 175A and second contact plug 175B. A first spacer insulating layer 173A may be disposed between the shielding pattern 160 and each of the first contact plugs 175A. A second spacer insulating layer 173B may be disposed between the shielding pattern 160 and each of the second contact plugs 175B.

The shielding pattern 160 may include a barrier metal 161 and a metal 163 on the barrier metal 161. In an embodiment, the barrier metal 161 may include a titanium nitride layer (TiN), and the metal 163 may include tungsten (W).

Referring to FIG. 4, a second insulating layer 171 may be formed on the shielding pattern 160. The first contact plugs 175A and the second contact plugs 175B may extend to penetrate the second insulating layer 171. The first spacer insulating layer 173A and the second spacer insulating layer 173B may extend to penetrate the second insulating layer 171. The first spacer insulating layer 173A and the second spacer insulating layer 173B may respectively include protrusion parts PPa and PPb that protrude toward sidewalls of the shielding pattern 160.

The second insulating layer 171 may be penetrated by third contact plugs 175C in contact with the shielding pattern 160. A sidewall of each of the third contact plugs 175C may be surrounded by a third spacer insulating layer 173C. The third spacer insulating layer 173C may be disposed on the second insulating layer 171 and may be formed to be shorter than each of the first spacer insulating layer 173A and the second spacer insulating layer 173B.

Each of the second insulating layer 171, the first spacer insulating layer 173A, the second spacer insulating layer 173B, and the third spacer insulating layer 173C may include an insulating material that is different from that of the first insulating layer 151. In an embodiment, each of the second insulating layer 171, the first spacer insulating layer 173A, the second spacer insulating layer 173B, and the third spacer insulating layer 173C may include an oxide.

The third contact plugs 173C may be formed to be shorter than each of the first contact plugs 175A and the second contact plugs 175B. Each of the first contact plugs 175A and the second contact plugs 175B may extend to penetrate the first insulating layer 151. Each of the first contact plugs 175A and the second contact plugs 175B may be formed to be longer than each of the first spacer insulating layer 173A and the second spacer insulating layer 173B.

The first contact plugs 175A, the second contact plugs 175B, and the third contact plugs 175C may be formed of various conductive materials. In an embodiment, each of the first contact plugs 175A, the second contact plugs 175B, and the third contact plugs 175C may include a titanium nitride layer (TiN) and tungsten (W).

The first upper line 193A and the second upper line 193B may be disposed in a second level LV2 on the second insulating layer 171. Each of the first upper line 193A and the second upper line 193B may be formed of a low resistance metal, such as aluminum (Al). Each of the first upper line 193A and the second upper line 193B may be formed to have a thickness that is thicker than that of the shielding pattern 160.

Figure 5C:
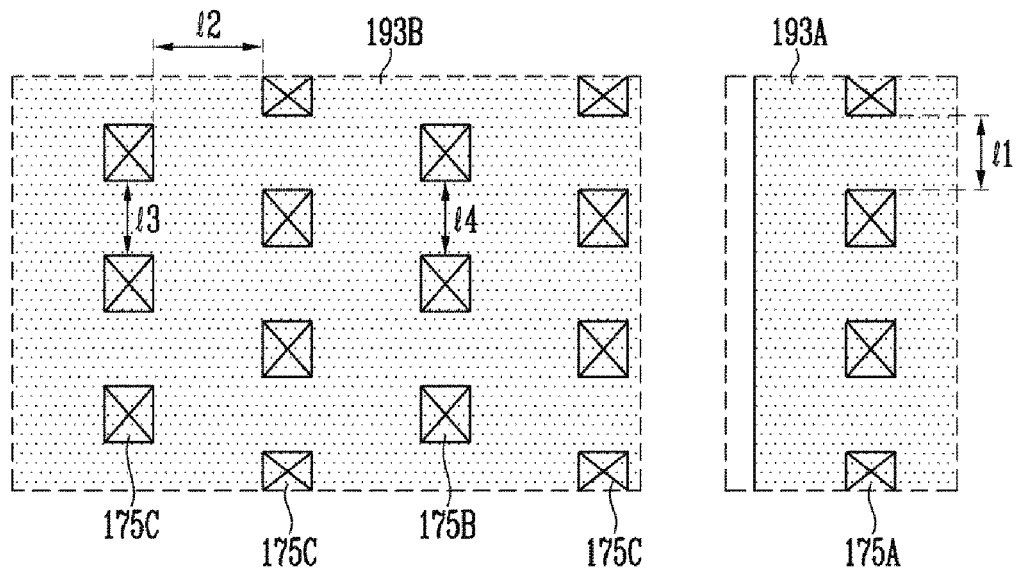
FIG. 5C is a plan view illustrating a layout of a first upper line and a second upper line, which are shown in FIG. 4.

FIG. 5C is a plan view illustrating a layout of the first upper line 193A and the second upper line 193B, which are shown in FIG. 4.

Referring to FIGS. 4 and 5C, the first upper line 193A and the second upper line 193B may be spaced apart from each other. The first upper line 193A and the second upper line 193B may be disposed at the second level LV2. The first upper line 193A may extend onto the second insulating layer 171 to overlap with the first bit lines 14361. The second upper line 193B may extend onto the second insulating layer 171 to overlap with the second bit lines 143B2.

The first contact plugs 175A may extend to be in contact with the first upper line 193A from the pad pattern 143A. The first upper line 193A may be connected to the pad pattern 143A through each of the first contact plugs 175A. The first contact plugs 175A may be spaced apart from each other in the direction in which the pad pattern 143A extends, by a first distance l1.

The second contact plugs 175B may extend to be in contact with the second upper line 193B from the common source line 143C. The second upper line 193B may be connected to the common source line 143C through each of the second contact plugs 157B. The source line driver 37 described with reference to FIG. 1 may be connected to the common source line 143C through the second upper line 193B. The second upper line 193B may be formed in a plate shape or a mesh type.

The third contact plugs 175C may extend from the shielding pattern 160 to be in contact with the second upper line 193B. The third contact plugs 175C may be spaced part from each other in the direction in which the bit lines 143B1 and 143B2 are spaced apart, by a second distance l2. The third contact plugs 175C may also be spaced apart from each other in the direction in which the bit lines 143B1 and 143B2 extend, by a third distance l3.

The second contact plugs 175B may be spaced apart from each other in the direction in which the common source line 143C extends, by a fourth interval l4.

The above-described first to fourth distances l1 to l4 may be designed with various numerical values and may be determined based on a design rule of the semiconductor memory device.

In accordance with the embodiment of the present disclosure, although the first upper line 193A that is used as a power line has a low resistance, coupling noise between the first bit lines 143B1 and the first upper line 193A may be reduced through the shielding pattern 160. Accordingly, the limitation of the degree of freedom of the arrangement of the first upper line 193A, due to coupling noise limitation, may be minimized.

In accordance with the embodiment of the present disclosure, the common source line 143C may be connected to the second upper line 193B through the shielding pattern 160, the second contact plugs 175B, and the third contact plugs 175C. Accordingly, the resistance of a mutual connection structure between the common source line 143C and the second upper line 193B may be decreased, and thus, source line bouncing may be minimized.

As described above, the coupling noise and the source line bouncing are minimized so that operational characteristics of the semiconductor memory device may be improved.

In accordance with the embodiment of the present disclosure, capacitance between the second upper line 193B and the second bit lines 143B2 may be increased by the shielding pattern 160. Accordingly, during an erase operation, the shielding pattern 160 may transfer a high voltage to the second bit lines 143B2 that overlap with the shielding pattern 160 due to capacitive coupling. As a result, erase efficiency may be improved even when high voltage transistors for applying a high voltage, such as an erase voltage to the second bit lines 143B2, might not be provided to the page buffer group 35 shown in FIG. 1.

Although a case where the memory cell array formed under the first level LV1 is a three-dimensional memory cell array is exemplified above, the memory cell array may be implemented as a two-dimensional memory cell array.

Hereinafter, a manufacturing method of the semiconductor memory device in accordance with an embodiment of the present disclosure will be schematically described. The following processes may be performed after a three-dimensional or two-dimensional memory cell array is formed on a substrate including a logic circuit.

FIGS. 6A to 6F are sectional views illustrating a manufacturing method of a semiconductor memory device in accordance with an embodiment of the present disclosure.

Figure 6A:
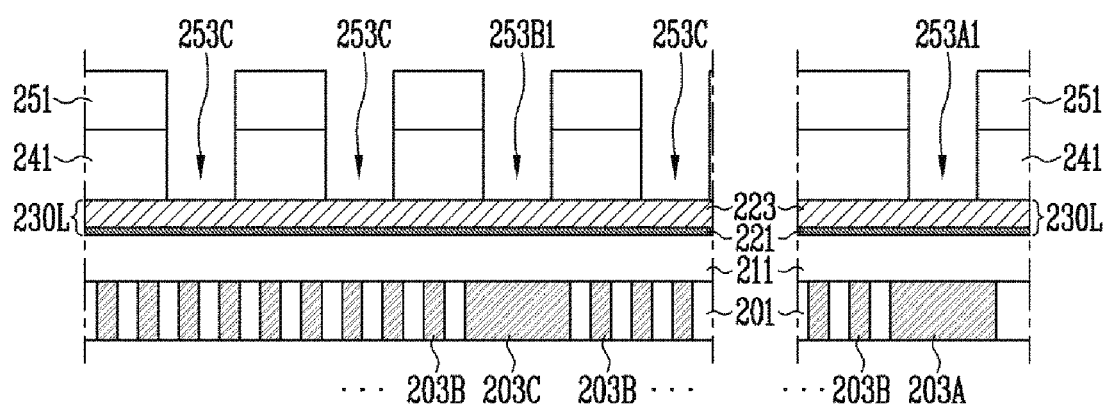
FIGS. 6A to 6F are sectional views illustrating a manufacturing method of a semiconductor memory device in accordance with an embodiment of the present disclosure.

Referring to FIG. 6A, a pad pattern 203A, bit lines 203B, and a common source line 203C may be formed to penetrate an upper insulating layer 201 that covers a memory cell array. The pad pattern 203A, the bit lines 203B, and the common source line 203C may be spaced apart from each other.

The bit lines 203B and the common source line 203C may be connected to the memory cell array. The bit lines 203B may correspond to the bit line BL shown in FIG. 3A or 3B, and the common source line 203C may correspond to the common source line CSL shown in FIG. 3A or 3B.

The pad pattern 203A may be connected to the output pad (not shown) to output the internal power voltage VCCI or the internal ground voltage VSSI, which are generated from the internal voltage generator 20 of the logic circuit LC shown in FIG. 1.

Each of the pad pattern 203A, the bit lines 203B, and the common source line 203C may include copper (Cu).

Subsequently, a first insulating layer 211 may be formed on the upper insulating layer 201. The first insulating layer 211 may extend to cover the pad pattern 203A, the bit lines 203B, and the common source line 203C. The first insulating layer 211 may prevent the diffusion of copper and may be formed of a material that can serve as an etch stop layer. In an embodiment, the first insulating layer 211 may include the nitrogen doped silicon carbide (NDC) described with reference to FIG. 4.

Subsequently, a shielding metal layer 230L and a second insulating layer 241 may be sequentially stacked on the first insulating layer 211. The shielding metal layer 230L may include a barrier metal 221 and a metal 223 on the barrier metal 221. The second insulating layer 241 may include an insulating material that is different from that of the first insulating layer 211. In an embodiment, the second insulating layer 241 may include oxide.

Subsequently, a first mask pattern 251 may be formed on the second insulating layer 241. A first hole 253A1, a second hole 25361, and a third hole 253C may be formed by etching the second insulating layer 241 through an etching process using the first mask pattern 251 as an etching barrier.

Each of the first hole 253A1, the second hole 25361, and the third hole 253C may expose the shielding metal layer 230L. The first hole 253A1 may overlap with the pad pattern 203A, the second hole 253B1 may overlap with the common source line 203C, and the third hole 253C may overlap with at least one bit line 203B.

The first mask pattern 251 may be removed after the shielding metal layer 230L is exposed.

Figure 6B:
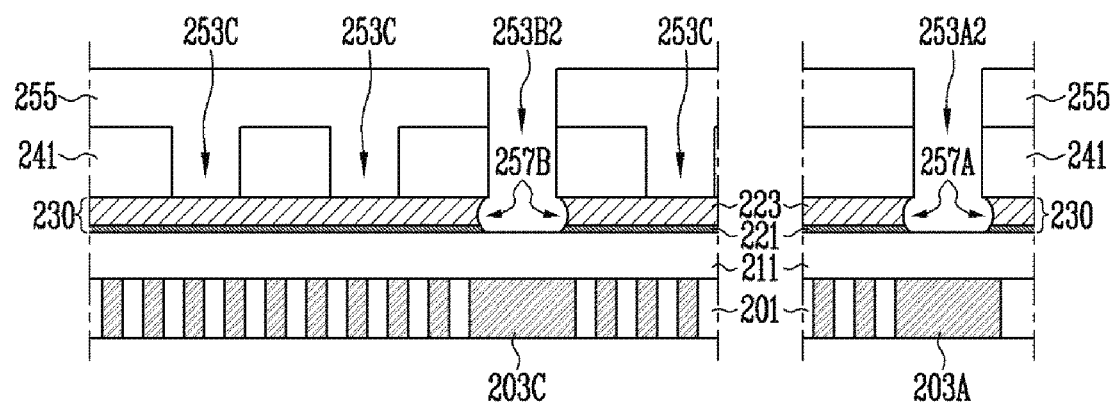

Referring to FIG. 6B, a second mask pattern 255 may be formed to fill the third hole 253C that is shown in FIG. 6A. The second mask pattern 255 may extend onto the second insulating layer 241. The second mask pattern 255 may include holes to open the first hole 253A1 and the second hole 253B1 shown in FIG. 6A.

Subsequently, the shielding metal layer 230L may be etched through an etching process by using the second mask pattern 255 as an etching barrier. Accordingly, an expanded first hole 253A2 and an expanded second hole 253B2 may be formed to expose the first insulating layer 211. The shielding metal layer 230L may be etched such that a first groove 257A and a second groove 257B are defined between the first insulating layer 211 and the second insulating layer 241. Accordingly, a shielding pattern 230 may be formed to have sidewalls that are defined along the first groove 257A and the second groove 257B. The first groove 257A may be connected to the expanded first hole 253A2, and the second groove 257B may be connected to the expanded second hole 253B2.

The second mask pattern 255 may be removed after the shielding pattern 230 is formed.

Figure 6C:
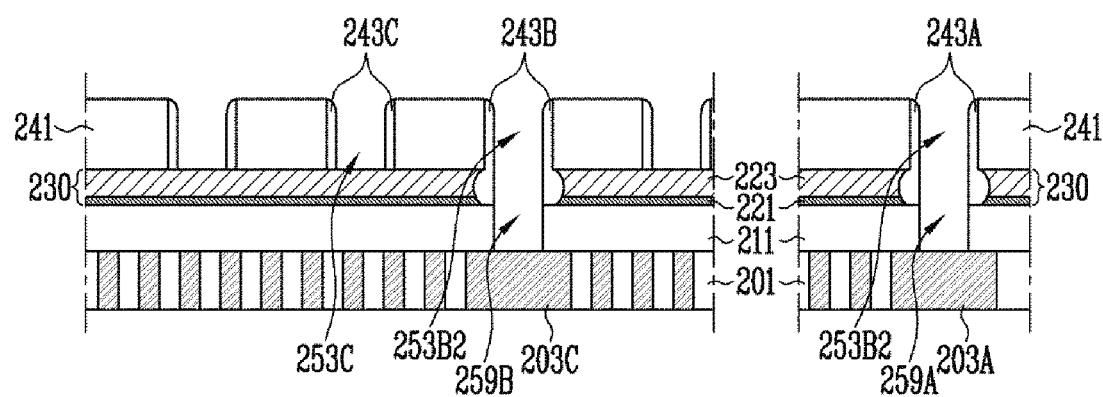

Referring to FIG. 6C, spacer insulating layers 243A, 243B, and 243C may be formed on sidewalls of the expanded first hole 253A2, the expanded second hole 235B2, and the third hole 253C, which are shown in FIG. 6B. The spacer insulating layers 243A, 243B, and 243C may be formed of an insulating material that is different from that of the first insulating layer 211. In an embodiment, the spacer insulating layers 243A, 243B, and 243C may include oxide.

The process of forming the spacer insulating layers 243A, 243B, and 243C may include a process of forming a spacer layer on surfaces of the expanded first hole 253A2, the expanded second hole 235B2, and the third hole 253C, which are shown in FIG. 6B, and may include a process of etching the spacer layer through an etch-back process.

The spacer insulating layers 243A, 243B, and 243C may include a first spacer insulating layer 243A, a second spacer insulating layer 243B, and a third spacer insulating layer 243C. The first spacer insulating layer 243A may be formed on the sidewall of the expanded first hole 253A2 to fill the first groove 257A shown in FIG. 6B. The second spacer insulating layer 243B may be formed on the sidewall of the expanded second hole 253B2 to fill the second groove 257B shown in FIG. 6B. The third spacer insulating layer 243C may be formed on the sidewall of the third hole 253C.

Subsequently, the first insulating layer 211 may be selectively etched through a central region of the expanded first hole 253A2 that is surrounded by the first spacer insulating layer 243A and a central region of the expanded second hole 253B2 that is surrounded by the second spacer insulating layer 243B. Accordingly, a first lower hole 259A may be formed to be connected to the expanded first hole 253A2. The first lower hole 259A may expose the pad pattern 203A. Furthermore, a second lower hole 259B may be formed to be connected to the expanded second hole 253B2. The second lower hole 259B may expose the common source line 203C.

Figure 6D:
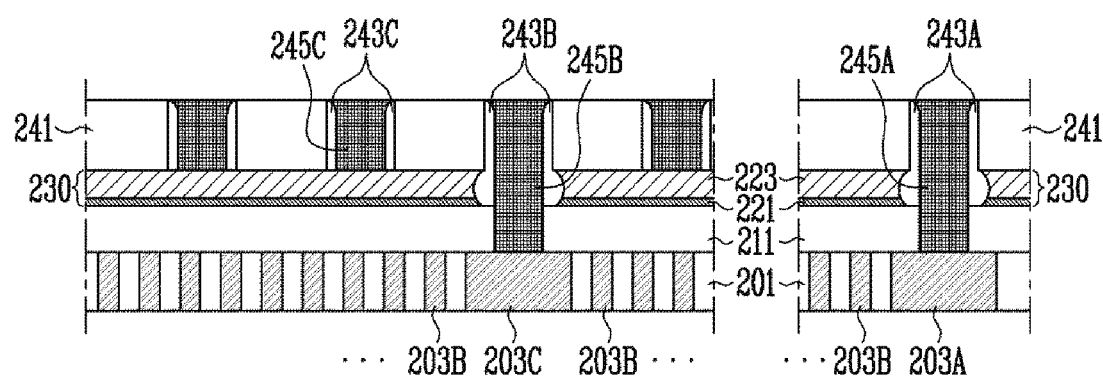

Referring to FIG. 6D, a first contact plug 245A, a second contact plug 245B, and a third contact plug 245C may be formed. The a first contact plug 245A, the second contact plug 245B, and the third contact plug 245C may be in contact with the pad pattern 203A, the common source line 203C, and the shielding pattern 230, respectively.

The process of forming the first contact plug 245A, the second contact plug 245B, and the third contact plug 245C may include a process of forming a conductive material on the first to third spacer insulating layers 243A to 243C to fill the first lower hole 259A, the expanded first hole 253A2, the second lower hole 259B, the expanded second hole 253B2, and the third hole 253C, which are shown in FIG. 6C, and may include a process of planarizing the conductive material to expose the second insulating layer 241. The conductive material may include a barrier metal and a metal on the barrier metal.

Through the above-described process, the first contact plug 245A that fills the first lower hole 259A and the expanded first hole 253A2 shown in FIG. 6C, the second contact plug 245B that fills the second lower hole 259B and the expanded second hole 253B2 shown in FIG. 6C, and the third contact plug 245C that fills the third hole 253C shown in FIG. 6C may be formed.

Figure 6E:
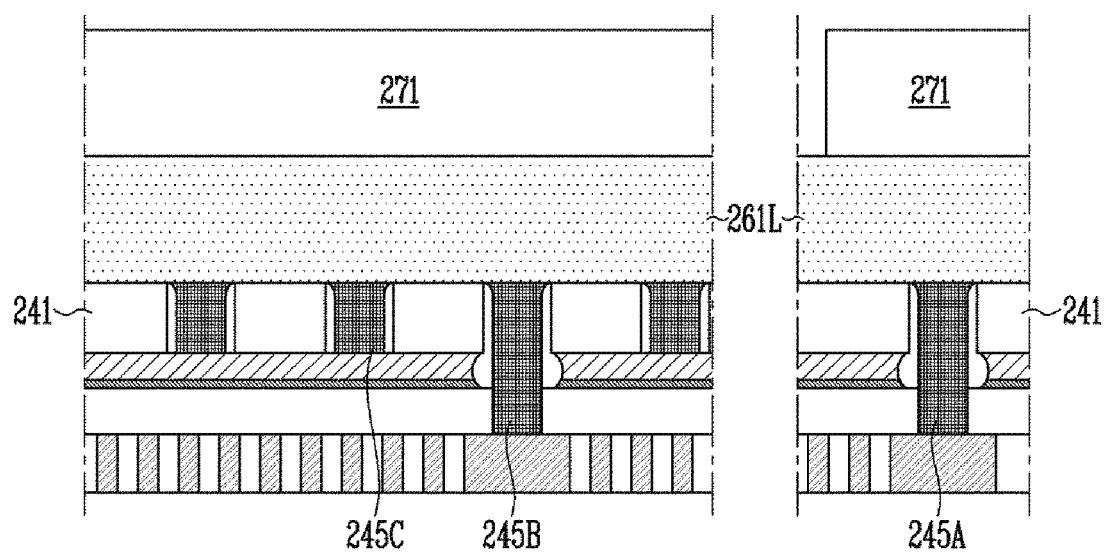

Referring to FIG. 6E, a conductive layer 261L may be formed on the second insulating layer 241. The conductive layer 261L may extend to cover the first to third contact plugs 245A to 245C. The conductive layer 261L may be formed in a structure in which a barrier metal, a metal, and an anti-reflection coating (ARC) are stacked. For example, each of the barrier metal and the ARC may include a titanium nitride layer (TiN), and the metal may include aluminum (Al).

Subsequently, mask patterns 271 may be disposed on the conductive layer 261L.

Figure 6F:
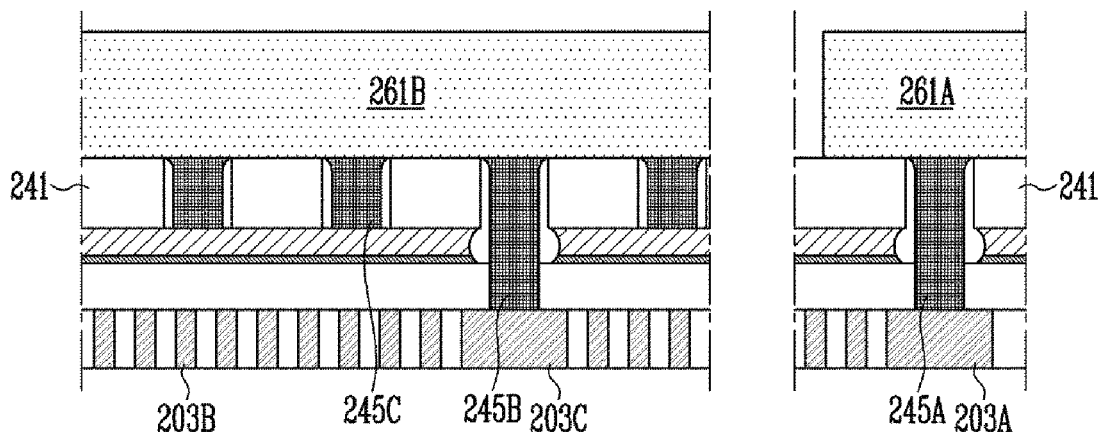

Referring to FIG. 6F, a first upper line 261A and a second upper line 261B may be formed through an etching process of the conductive layer 261L by using the mask patterns 271 shown in FIG. 6E, as an etching barrier. The first upper line 261A and the second upper line 261B may be isolated from each other. The mask patterns 271 may be removed after the first upper line 261A and the second upper line 261B are formed.

The first upper line 261A may be in contact with the first contact plug 245A and may extend onto the second insulating layer 241. The first upper line 261A may overlap with some of the bit lines 203B.

The second upper line 261B may be in contact with the second contact plug 245B and may extend to overlap with the second insulating layer 241 and the third contact plug 245C.

Figure 7:
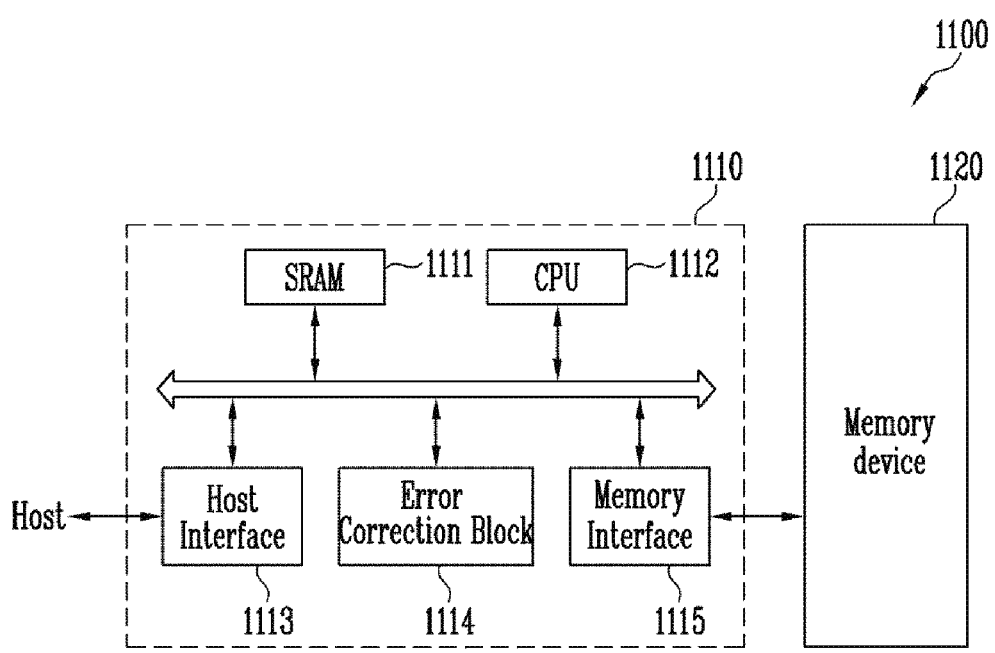
FIG. 7 is a block diagram illustrating a configuration of a memory system in accordance with an embodiment of the present disclosure.

FIG. 7 is a block diagram illustrating a configuration of a memory system 1100 in accordance with an embodiment of the present disclosure.

Referring to FIG. 7, the memory system 1100 may include a memory device 1120 and a memory controller 1110.

The memory device 1120 may be a multi-chip package that is configured with a plurality of flash memory chips. The memory device 1120 may include bit lines and a common source line, which are connected to a memory cell array, and a pad pattern which is spaced apart from the bit lines and the common source line and transmits an internal voltage. Also, the memory device 1120 may include a first upper line and a second upper line, which are disposed in a second level spaced apart from a first level in which the bit lines, the common source line, and the pad pattern are disposed, and include a shielding pattern disposed between the first level and the second level. The first upper line may be connected to the pad pattern to transmit an internal voltage, and the second upper line may transmit operation voltages necessary for an erase operation to the common source line. The shielding pattern may be insulated from the first upper line, and be connected to the second upper line.

The memory controller 1110 may control the memory device 1120 and may include a Static Random Access Memory (SRAM) 1111, a Central Processing Unit (CPU) 1112, a host interface 1113, an error correction block 1114, and a memory interface 1115. The SRAM 1111 may be used as an operation memory of the CPU 1112, the CPU 1112 may perform overall control operations for data exchange of the memory controller 1110, and the host interface 1113 may include a data exchange protocol for a host connected with the memory system 1100. The error correction block 1114 may detect an error included in a data read from the memory device 1120, and corrects the detected error. The memory interface 1115 may interface with the memory device 1120. The memory controller 1110 may further include a Read Only Memory (ROM) for storing code data for interfacing with the host, and the like.

The memory system 1100 configured as described above may be a memory card or a Solid State Drive (SSD) in which the memory device 1120 is combined with the memory controller 1110. For example, when the memory system 1100 is an SSD, the memory controller 1100 may communicate with an external device (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 8:
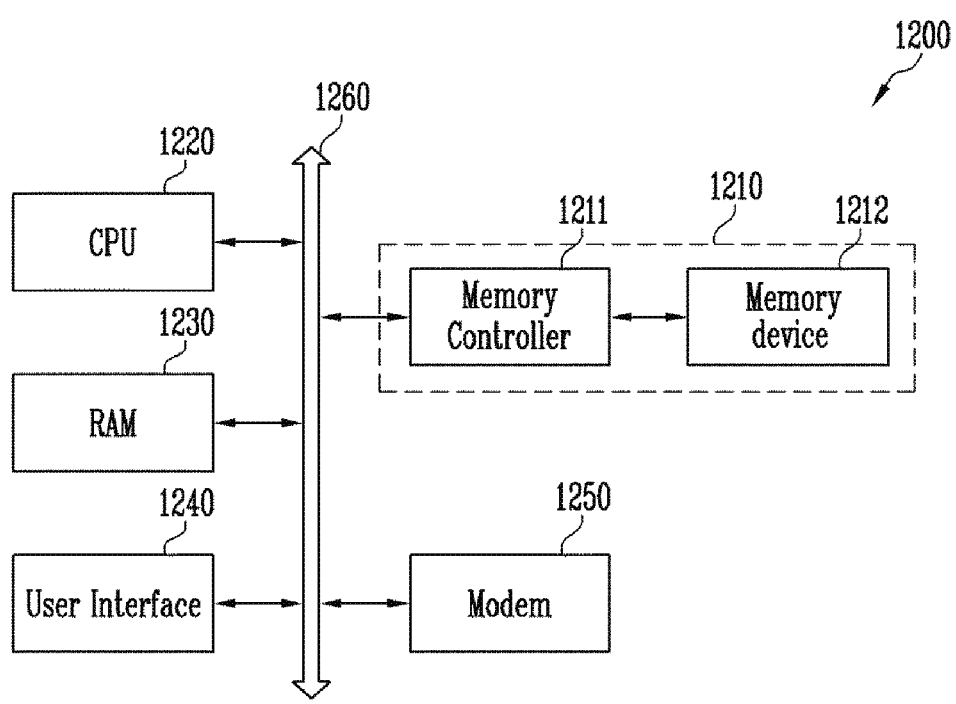
FIG. 8 is a block diagram illustrating a configuration of a computing system in accordance with an embodiment of the present disclosure.

FIG. 8 is a block diagram illustrating a configuration of a computing system 1200 in accordance with an embodiment of the present disclosure.

Referring to FIG. 8, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an image processor, an image sensor, a mobile DRAM, and the like may be further included. The image sensor may include complementary metal-oxide semiconductor image sensor (CIS).

The memory system 1210 may be configured with a memory device 1212 and a memory controller 1211 as described with reference to FIG. 7.

In accordance with the present disclosure, a shielding pattern is disposed between a bit line and an upper line, so that coupling noise between the bit line and the upper line may be reduced. Accordingly, the limitation of the degree of freedom of the arrangement of the upper line may be reduced, and the operational reliability of the semiconductor memory device may be improved.

What is claimed is:
1. A semiconductor memory device comprising:
   bit lines and a common source line connected to a memory cell array, wherein the bit lines and the common source line are spaced apart from each other in a first level;
   a pad pattern spaced apart from the bit lines and the common source line in the first level;
   a first insulating layer covering the bit lines, the common source line, and the pad pattern;
   a shielding pattern overlapping with the bit lines and disposed on the first insulating layer;
   a first upper line and a second upper line spaced apart from each other above the shielding pattern;

a first contact plug extending from the pad pattern to be in contact with the first upper line;
a second contact plug extending from the common source line to be in contact with the second upper line;
a first spacer insulating layer extending toward the first upper line from between the shielding pattern and the first contact plug; and
a second spacer insulating layer extending toward the second upper line from between the shielding pattern and the second contact plug.

2. The semiconductor memory device of claim 1, further comprising a second insulating layer that overlaps with the shielding pattern,
wherein each of the first spacer insulating layer, the second spacer insulating layer, the first contact plug, and the second contact plug extends to penetrate the second insulating layer.

3. The semiconductor memory device of claim 1, wherein each of the first and second spacer insulating layers includes a protrusion part that protrudes toward a sidewall of the shielding pattern.

4. The semiconductor memory device of claim 1, further comprising:
a third contact plug extending from the shielding pattern to be in contact with the second upper line; and
a third spacer insulating layer surrounding a sidewall of the third contact plug, on the shielding pattern.

5. The semiconductor memory device of claim 4, wherein the third spacer insulating layer is formed to be shorter than each of the first and second spacer insulating layers.

6. The semiconductor memory device of claim 1, wherein the first upper line is a power line for transmitting a power voltage or a ground voltage.

7. The semiconductor memory device of claim 1, wherein the bit lines include a first bit line that overlaps with the first upper line and a second bit line overlapping with the second upper line.

8. The semiconductor memory device of claim 1, wherein the memory cell array includes:
a source semiconductor layer including a dopant;
channel structures extending from the source semiconductor layer; and
interlayer insulating layers and conductive patterns alternately stacked on the source semiconductor layer, wherein the interlayer insulating layers and the conductive patterns surround the channel structures.

9. The semiconductor memory device of claim 8, further comprising:
drain contact structures connecting the bit lines to the channel structures; and
a source contact structure connecting the common source line to the source semiconductor layer.

10. The semiconductor memory device of claim 1, wherein the first and second spacer insulating layers include an insulating material that is different from that of the first insulating layer.

11. The semiconductor memory device of claim 1, wherein the first insulating layer includes nitrogen doped silicon carbide, and
each of the first and second spacer insulating layers includes oxide.

12. A method of manufacturing a semiconductor memory device, the method comprising:
forming bit lines, a common source line, and a pad pattern spaced apart from each other;
forming a first insulating layer that covers the bit lines, the common source line, and the pad pattern;
sequentially stacking a shielding metal layer and a second insulating layer on the first insulating layer;
forming a first hole that overlaps with the pad pattern by etching the second insulating layer and the shielding metal layer;
forming a first spacer insulating layer on a sidewall of the first hole;
forming a first contact plug on the first spacer insulating layer by filling the first hole, wherein the first contact plug extends to be in contact with the pad pattern; and
forming a first upper line that is connected to the first contact plug, wherein the first upper line extends onto the second insulating layer.

13. The method of claim 12, further comprising:
forming, when the first hole is formed, a second hole that overlaps with the common source line by etching the second insulating layer and the shielding metal layer;
forming, when the first spacer insulating layer is formed, a second spacer insulating layer on a sidewall of the second hole;
forming, when the first contact plug is formed, a second contact plug that fills the second hole on the second spacer insulating layer and extends to be in contact with the common source line; and
forming, when the first upper line is formed, a second upper line that is connected to the second contact plug and extends onto the second insulating layer.

14. The method of claim 13, further comprising:
forming, when the first hole is formed, a third hole that overlaps with at least one of the bit lines and exposes the shielding metal layer;
forming, when the first spacer insulating layer is formed, a third spacer insulating layer on a sidewall of the third hole; and
forming, when the first contact plug is formed, a third contact plug in contact with the shielding metal layer,
wherein the second upper line extends to be connected to the third contact plug.

15. The method of claim 12, wherein the forming of the first hole includes:
etching the second insulating layer to expose the shielding metal layer; and
etching the shielding metal layer to define a groove between the second insulating layer and the first insulating layer and to expose the first insulating layer.

16. The method of claim 12, wherein the forming of the first contact plug includes:
forming a lower hole that exposes the pad pattern by etching the first insulating layer through a central region of the first hole surrounded by the first spacer insulating layer; and
forming a conductive material that extends to fill the first hole on the first spacer insulating layer and to fill the lower hole.

17. The method of claim 12, wherein the first insulating layer includes nitrogen doped silicon carbide, and
the first spacer insulating layer includes oxide.

18. A semiconductor memory device comprising:
bit lines and a common source line connected to a memory cell array, wherein the bit lines and the common source line are spaced apart from each other in a first level;
a pad pattern spaced apart from the bit lines and the common source line in the first level;
a first insulating layer covering the bit lines, the common source line, and the pad pattern;

a shielding pattern overlapping with the bit lines and disposed on the first insulating layer;

a first upper line and a second upper line spaced apart from each other above the shielding pattern;

a plurality of contact plugs extending from the first and second upper lines toward the bit lines, common source line, and pad pattern, wherein one or more of the plurality of contact plugs connect the shielding pattern to the second upper line.

19. The semiconductor memory device of claim 18, wherein the plurality of contact plugs comprises:

a first contact plug extending from the pad pattern to be in contact with the first upper line;

a second contact plug extending from the common source line to be in contact with the second upper line;

one or more third contact plugs extending from the shielding pattern to be in contact with the second upper line.

\* \* \* \* \*